(12) United States Patent
Heschl

(10) Patent No.: US 10,601,312 B2
(45) Date of Patent: Mar. 24, 2020

(54) BANDWIDTH ADAPTATION IN A PHASE-LOCKED LOOP OF A LOCAL OSCILLATOR

(71) Applicant: Infineon Technologies AG, Neubiberg (DE)

(72) Inventor: Lukas Heschl, Linz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/408,708

(22) Filed: May 10, 2019

(65) Prior Publication Data

US 2019/0379281 A1 Dec. 12, 2019

(30) Foreign Application Priority Data

Jun. 6, 2018 (DE) .......................... 10 2018 113 439

(51) Int. Cl.
*H02M 3/07* (2006.01)
*H03L 7/093* (2006.01)
*G01S 7/03* (2006.01)
*G01S 13/32* (2006.01)
*G01S 7/35* (2006.01)
*H03L 7/099* (2006.01)

(52) U.S. Cl.
CPC .............. *H02M 3/07* (2013.01); *G01S 7/032* (2013.01); *G01S 7/35* (2013.01); *G01S 13/32* (2013.01); *H03L 7/093* (2013.01); *H03L 7/099* (2013.01)

(58) Field of Classification Search
None
See application file for complete search history.

(56) References Cited

U.S. PATENT DOCUMENTS

| 7,102,401 | B2 * | 9/2006 | Galloway | ............. H03L 7/0891 |
| | | | | 327/157 |
| 8,872,556 | B1 * | 10/2014 | Chen | ....................... H03L 7/103 |
| | | | | 327/156 |
| 2003/0231068 | A1 | 12/2003 | Humphreys | |
| 2005/0052251 | A1 | 3/2005 | Jensen et al. | |
| 2005/0156673 | A1 | 7/2005 | Pretl et al. | |
| 2007/0247235 | A1 | 10/2007 | Gatta | |
| 2009/0174446 | A1 | 7/2009 | Park | |
| 2010/0171535 | A1 | 7/2010 | Shanan | |
| 2010/0203848 | A1 | 8/2010 | Darabi et al. | |
| 2010/0321074 | A1 | 12/2010 | Song | |
| 2018/0097521 | A1 * | 4/2018 | Hammerschmidt | .. H03L 7/0893 |

* cited by examiner

*Primary Examiner* — Cassandra F Cox
(74) *Attorney, Agent, or Firm* — Harrity & Harrity, LLP

(57) ABSTRACT

An RF circuit comprises a charge pump configured to generate current pulses having a first current amplitude and a predetermined duration; and a capacitive element configured to receive the current pulses and to generate a tuning voltage depending thereon. An RF oscillator is configured to generate an RF signal having a frequency that is dependent on the tuning voltage. The RF circuit comprises a measuring circuit configured to generate a measurement signal representing the tuning voltage or the frequency of the RF signal. A controller circuit is configured to drive the charge pump in order to change the first amplitude of a current pulse by a current difference, and ascertain a first change in the measurement signal and a second change in the measurement signal. A measurement value for the first amplitude can be calculated based on the first change and the second change based on the current difference.

20 Claims, 8 Drawing Sheets

BANDWIDTH ADAPTATION IN A PHASE-LOCKED LOOP OF A LOCAL OSCILLATOR

CROSS REFERENCE TO RELATED APPLICATION

This application claims priority under 35 U.S.C. § 119 to German Patent Application No. 102018113439.8 filed on Jun. 6, 2018, the content of which is incorporated by reference herein in its entirety.

TECHNICAL FIELD

The present description relates to the field of radar sensors, and a phase-locked loop having a voltage controlled oscillator (VCO) for generating an RF oscillator signal.

BACKGROUND

Radio-frequency (RF) transmitters and receivers are used in a multiplicity of applications, particularly in the field of wireless communication and radar sensors. In the automotive field there is an increasing need for radar sensors which can be used, inter alia, in driver assistance systems (Advanced driver assistance systems, ADAS) such as e.g. in cruise control (ACC, Adaptive Cruise Control, or Radar Cruise Control) systems. Such systems can automatically adapt the speed of an automobile in order thus to maintain a safe distance from other automobiles ahead (and also other objects and pedestrians). Further applications in the automotive field are e.g. blind spot detection, lane change assist and the like.

Modern radar systems use large scale integrated RF circuits which can contain all core functions of an RF frontend of a radar transceiver in a single chip housing (single-chip transceiver). Such RF frontends can comprise, inter alia, an RF local oscillator (LO), power amplifiers, low noise amplifiers (LNAs) or mixers.

Frequency-modulated continuous-wave (FMCW) radar systems use radar signals that include sequences of so-called chirps. In order to generate such chirps, the radar device can comprise a local oscillator comprising a VCO arranged in a phase-locked loop (PLL). The frequency of the VCO is set by way of a control voltage, which can be tuned by adapting the frequency division ratio of a frequency divider in the feedback loop of the PLL. In order to keep the phase noise of the local oscillator output signal within specified limits, the bandwidth of the PLL can be designed in accordance with these specified limits. However, the bandwidth of the PLL is generally dependent on parameters that are subject to a certain variation on account of tolerances in the production process.

SUMMARY

An RF circuit is described hereinafter. In accordance with one example implementation, the RF circuit comprises a charge pump configured to generate current pulses having a first current amplitude and a predetermined duration. The RF circuit furthermore comprises a capacitive element coupled to the charge pump and configured to receive the current pulses and to generate a tuning voltage depending thereon. A RF oscillator is coupled to the capacitive element and configured to generate an RF signal having a frequency that is dependent on the tuning voltage. The RF circuit furthermore comprises a measuring circuit configured to generate a measurement signal representing the tuning voltage or the frequency of the RF signal. A controller circuit is coupled to the charge pump and the measuring circuit and configured to drive the charge pump in order to change the first amplitude of a current pulse by a current difference. The controller circuit is furthermore configured to ascertain a first change in the measurement signal, which first change is a reaction to a first current pulse of the current pulses having the first current amplitude, and a second change in the measurement signal, which second change is a reaction to a second current pulse of the current pulses having a changed current amplitude. A measurement value for the first amplitude can be calculated on the basis of the first change in the measurement signal and the second change in the measurement signal and on the basis of the current difference.

Furthermore, a method is described which, in accordance with one example implementation, comprises the following: generating current pulses having a settable current amplitude and a predetermined defined duration using a charge pump, wherein generating current pulses comprises generating a first current pulse having a first amplitude and generating a second current pulse having a second amplitude, which differs from the first amplitude by a current difference; and converting the current pulses into a tuning voltage for an RF oscillator in such a way that the tuning voltage changes as a reaction to each current pulse depending on the amplitude thereof. In this case, the frequency of the RF oscillator is dependent on the tuning voltage. The method furthermore comprises generating a measurement signal representing the tuning voltage or the frequency of the RF oscillator; determining a first change in the measurement signal as a reaction to the first current pulse and a second change in the measurement signal as a reaction to the second current pulse; and calculating the first amplitude on the basis of the current difference and the first change in the measurement signal and the second change in the measurement signal.

BRIEF DESCRIPTION OF THE DRAWINGS

Example implementations are explained in greater detail below with reference to figures. The illustrations are not necessarily true to scale and the example implementations are not restricted only to the aspects illustrated. Rather, importance is attached to illustrating the principles underlying the example implementations. In the figures.

DETAILED DESCRIPTION

Figure 1:
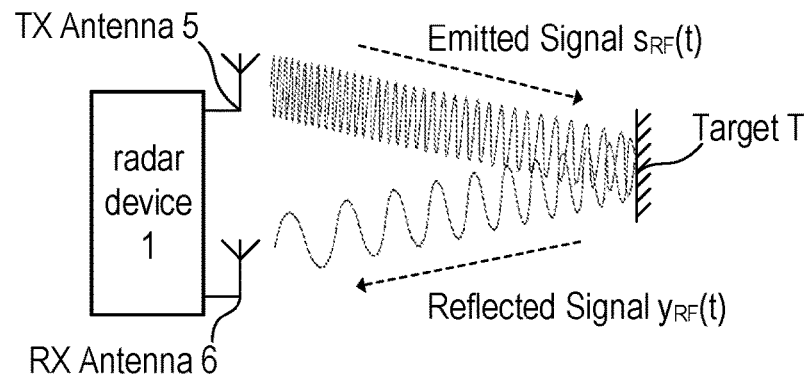
FIG. 1 is a schematic diagram for illustrating the functional principle of an FMCW radar system for distance and/or speed measurement.

FIG. 1 illustrates, in a schematic diagram, the application of an FMCW radar system, as sensor for the measurement of distances and speeds of objects, which are usually referred to as radar targets. In the present example, the radar device 1 comprises separate transmitting (TX) and receiving (RX) antennas 5 and 6 respectively (bistatic or pseudo-monostatic radar configuration). It should be noted, however, that a single antenna can also be used, which serves simultaneously as transmitting antenna and as receiving antenna (monostatic radar configuration). The transmitting antenna 5 emits a continuous RF signal $s_{RF}(t)$, which is frequency-modulated for example with a type of sawtooth signal (periodic, linear frequency ramp). The emitted signal $s_{RF}(t)$ is backscattered at the radar target T and the backscattered/reflected signal $y_{RF}(t)$ is received by the receiving antenna 6. FIG. 1 shows a simplified example; in practice, radar sensors are systems comprising a plurality of transmitting (TX) and receiving (RX) channels, in order also to be able to determine the angle of incidence (Direction of Arrival, DoA) of the backscattered/reflected signal $y_{RF}(t)$ and thus to be able to localize the radar target T more accurately.

Figure 2:
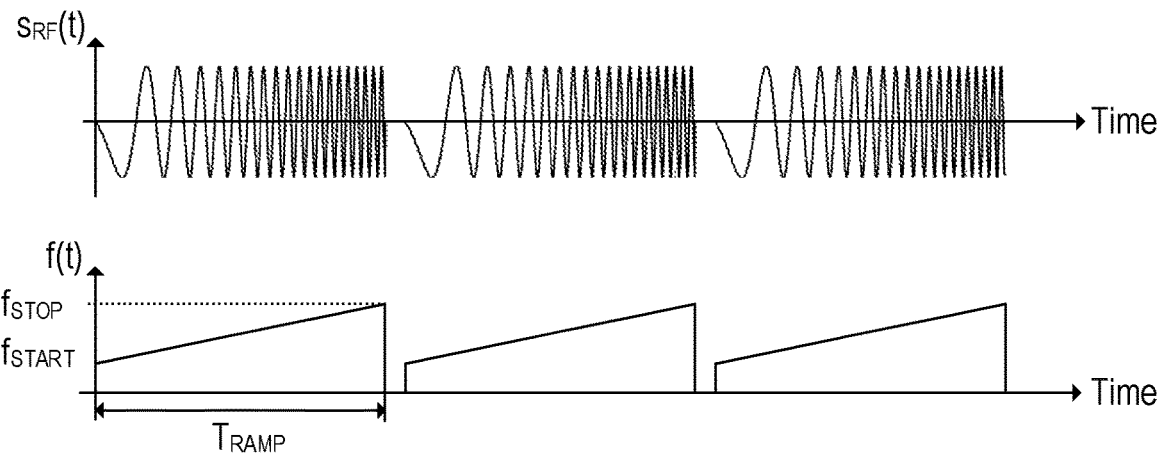
FIG. 2 comprises two timing diagrams for illustrating the frequency modulation (FM) of the RF signal generated by the FMCW system.

FIG. 2 illustrates, by way of example, the abovementioned frequency modulation of the signal $s_{RF}(t)$. As illustrated in FIG. 2, the emitted RF signal $s_{RF}(t)$ is composed of a set of "chirps", that is to say that the signal $s_{RF}(t)$ comprises a sequence of sinusoidal signal profiles (waveforms) having a rising (Up-Chirp) or falling (Down-Chirp) frequency (see upper diagram in FIG. 2). In the present example, the instantaneous frequency f(t) of a chirp beginning at a start frequency $f_{START}$ rises linearly within a time period $T_{RAMP}$ to a stop frequency $f_{STOP}$ (see lower diagram in FIG. 2). Such chirps are also referred to as linear frequency ramps. FIG. 2 illustrates three identical linear frequency ramps. It should be noted, however, that the parameters $f_{START}$, $f_{STOP}$, $T_{RAMP}$ and also the pause between the individual frequency ramps can vary. The frequency variation also need not necessarily be linear (linear chirp). Depending on the implementation, transmission signals with exponential or hyperbolic frequency variation (exponential or hyperbolic chirps, respectively) can also be used, for example.

Figure 3:
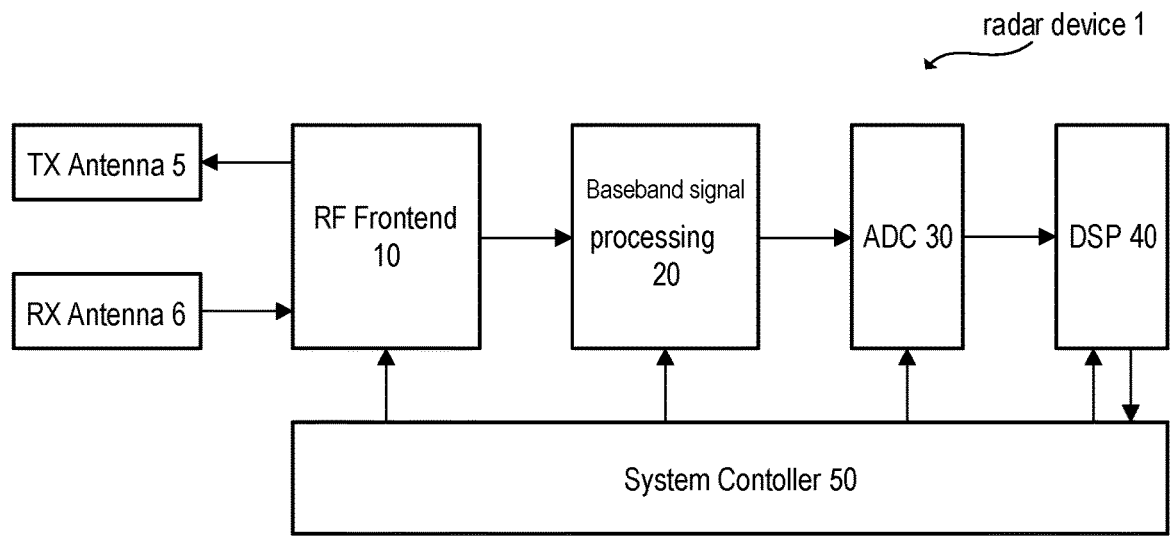
FIG. 3 is a block diagram for illustrating the fundamental structure of an FMCW radar system.

FIG. 3 is a block diagram which illustrates one possible structure of a radar device 1 (radar sensor) by way of example. Accordingly, at least one transmitting antenna 5 (TX antenna) and at least one receiving antenna 6 (RX antenna) are connected to an RF frontend 10 which is integrated in a chip and which can include all those circuit components which are used for the RF signal processing. The circuit components comprise, for example, a local oscillator (LO), RF power amplifiers, low-noise amplifiers (LNAs), directional couplers (e.g. rat race couplers, circulators, etc.) and mixers for down-converting the RF signals to baseband or an intermediate frequency band (IF band). The RF frontend 10 if appropriate together with further circuit components can be integrated in a chip, which is usually referred to as a monolithic microwave integrated circuit (MMIC).

The example illustrated shows a bistatic (or pseudo-monostatic) radar system comprising separate RX and TX antennas. In the case of a monostatic radar system, a single antenna would be used both for emitting and for receiving the electromagnetic (radar) signals. In this case, a directional coupler (e.g. a circulator) can be used to separate the RF signals to be emitted from the RF signals (radar echoes) received. As mentioned, radar systems in practice usually comprise a plurality of transmitting and receiving channels (TX/RX channels) having a plurality of TX and RX antennas, respectively, which makes it possible, inter alfa, to measure the direction (DoA) from which the radar echoes are received. In MIMO systems of this type, the individual TX channels and RX channels are usually constructed identically or similarly in each case.

In the case of a FMCW radar system, the RF signals emitted via the TX antenna 5 can lie e.g. in the range of approximately 20 GHz to 100 GHz (e.g. around 77 GHz in some applications). As mentioned, the RF signal received by the RX antenna 6 comprises the radar echoes (chirp echo signals), e.g. those signal components which are backscattered at one or at a plurality of radar targets. The received RF signal $y_{RF}(t)$ is e.g. down-converted to baseband (or an IF band) and processed further in baseband using analog signal processing (see FIG. 3, analog baseband signal processing chain 20). The analog signal processing mentioned substantially comprises filtering and, if appropriate, amplification of the baseband signal. The baseband signal is finally digitized (see FIG. 3, analog-to-digital converter 30) and processed further in the digital domain. The digital signal processing chain can be realized at least partly as software which can be executed on a processor, for example a microcontroller or a digital signal processor (see FIG. 3, DSP 40). The overall system is generally controlled using a system controller 50, which can likewise be implemented at least partly as software which can be executed on a processor such as e.g. a microcontroller. The RF frontend 10 and the analog baseband signal processing chain 20 (optionally also the analog-to-digital converter 30) can be jointly integrated in a single MMIC (e.g. an RF semiconductor chip). Alternatively, the individual components can also be distributed among a plurality of integrated circuits.

Figure 4:
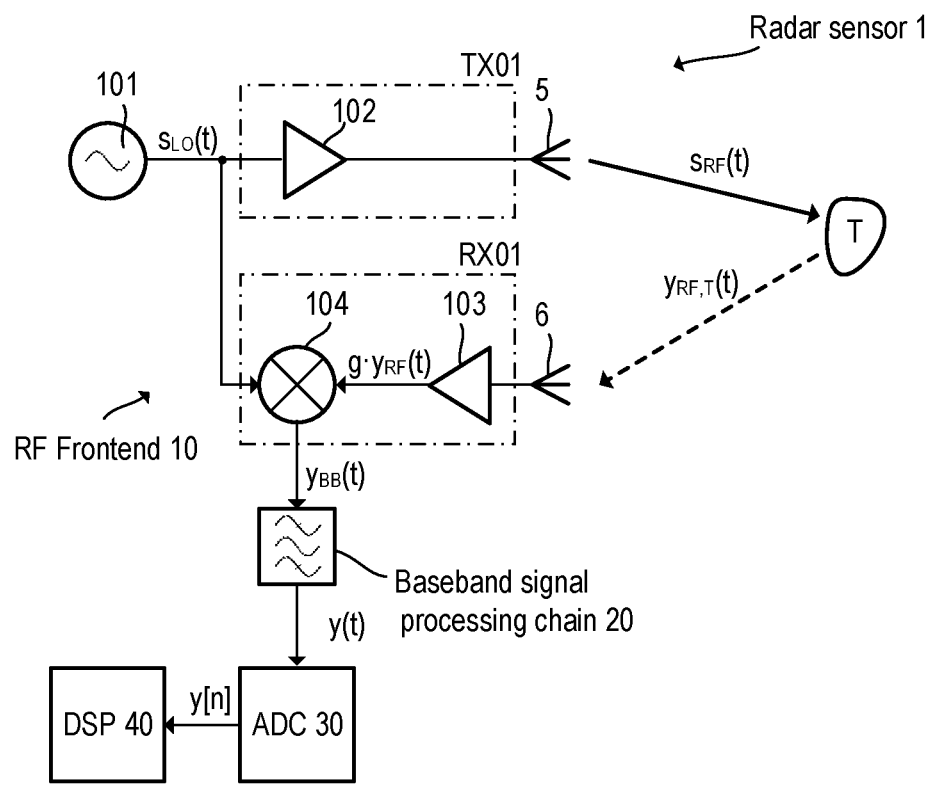
FIG. 4 is a block diagram for illustrating one example of an integrated RF frontend circuit of a radar chip including analog baseband signal processing.

FIG. 4 illustrates one example implementation of a radar transceiver 1 in accordance with the example from FIG. 3 in greater detail. The present example illustrates in particular the RF frontend 10 of the radar transceiver 1 and the downstream signal processing in baseband. It should be noted that FIG. 4 illustrates a simplified circuit diagram in order to show the fundamental structure of the RF frontend 10 with one TX channel and one RX channel. Actual implementations, which may depend greatly on the specific application, can be more complex, of course, and generally comprise a plurality of TX and/or RX channels.

The RF frontend 10 comprises a local oscillator 101 (LO), which generates an RF oscillator signal $s_{LO}(t)$. The RF oscillator signal $s_{LO}(t)$ is frequency-modulated in radar operation, as described above with reference to FIG. 2, and is also referred to as LO signal. In radar applications, the frequency $f_{LO}$ of the LO signal $s_{LO}(t)$ usually lies in the SHF (Super High Frequency, centimeter-wave) or in the EHF (Extremely High Frequency, millimeter-wave) band, e.g. in the interval of 76 GHz to 81 GHz in some automotive applications. The LO signal $s_{LO}(t)$ is processed both in the transmission signal path TX01 (in the TX channel) and in the reception signal path RX01 (in the RX channel). The local oscillator 101 usually includes a VCO (see also FIG. 5) interconnected in a phase-locked loop (PLL).

The transmission signal $s_{RF}(t)$ (cf. FIG. 2), emitted by the TX antenna 5, is generated by amplifying the LO signal $s_{LO}(t)$, for example using the RF power amplifier 102, and is thus merely an amplified version of the LO signal $s_{LO}(t)$. The output of the amplifier 102 can be coupled to the TX antenna 5 (in the case of a bistatic or pseudo-monostatic radar configuration). The reception signal $y_{RF}(t)$ received by the RX antenna 6 is fed to the receiver circuit in the RX channel and thus directly or indirectly to the RF port of the mixer 104. In the present example, the RF reception signal $y_{RF}(t)$ (antenna signal) is preamplified using the amplifier 103 (gain g). The amplified RF reception signal $g \cdot y_{RF}(t)$ is thus received by the mixer 104. The amplifier 103 can be e.g. an LNA. The LO signal $s_{LO}(t)$ is fed to the reference port of the mixer 104, such that the mixer 104 down-converts the (preamplified) RF reception signal $y_{RF}(t)$ to baseband. The down-converted baseband signal (mixer output signal) is designated by $y_{BB}(t)$. The baseband signal $y_{BB}(t)$ is firstly processed further in analog fashion, wherein the analog baseband signal processing chain 20 substantially brings about amplification and (e.g. bandpass or lowpass) filtering in order to suppress undesired sidebands and image frequencies. The resulting analog output signal, which is fed to an analog-to-digital converter (see FIG. 3, ADC 30), is designated by y(t). Methods for the digital further processing of the digitized output signal (digital radar signal y[n]) for detecting radar targets are known per se (for example range doppler analysis) and therefore will not be discussed in further detail here.

Figure 5:
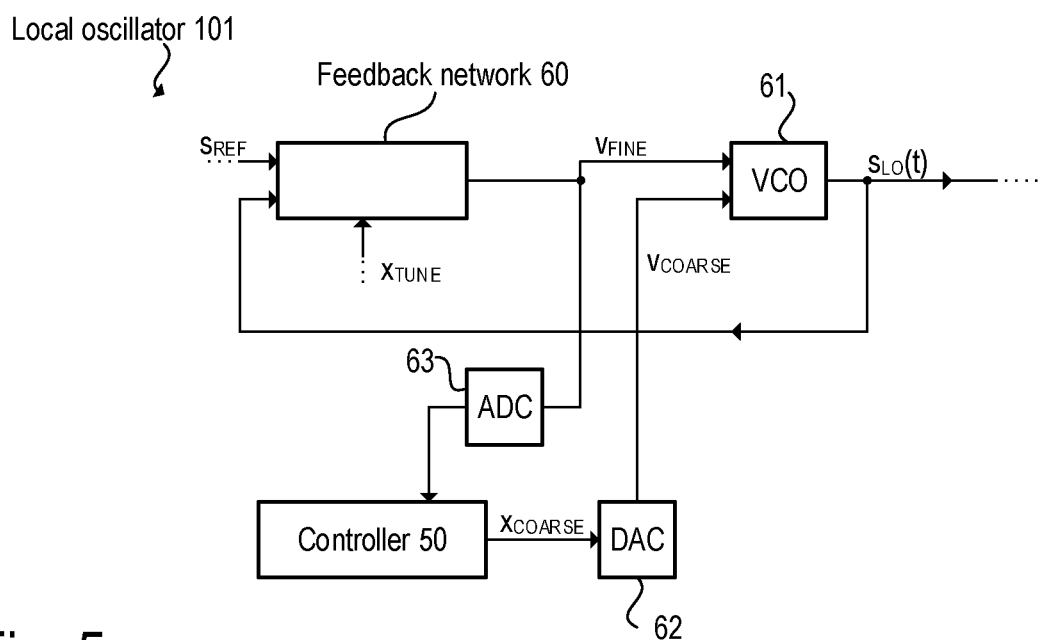
FIG. 5 is a block diagram for illustrating a first example of a local oscillator with a VCO interconnected in a phase-locked loop.

In the present example, the mixer 104 down-converts the preamplified RF reception signal $g \cdot y_{RF}(t)$ (e.g. the amplified antenna signal) to baseband. The mixing can take place in one stage (that is to say from the RF band directly to baseband) or via one or more intermediate stages (that is to say from the RF band to an intermediate frequency band and further to baseband). In this case, the reception mixer 104 effectively comprises a plurality of individual mixer stages connected in series. In view of the example shown in FIG. 4, it becomes clear that the quality of a radar measurement depends greatly on the quality of the LO signal $s_{LO}(t)$, inter alfa on the noise contained in the LO signal $s_{LO}(t)$. This noise is quantitatively determined by the phase noise of the local oscillator 101 and thus by the bandwidth of the phase-locked loop, FIG. 5 shows a block diagram of one example implementation of a local oscillator that can be used e.g. in the RF frontend 10 from FIG. 4. In accordance with FIG. 5, the local oscillator 101 comprises a VCO 61 configured to generate an RF oscillator signal $s_{LO}(t)$ (e.g. the LO signal), the frequency $f_{LO}$ of which is dependent on one or more input voltages (tuning voltages). The frequency $f_{LO}$ is usually a nonlinear function of the input voltage(s). In the example illustrated, the VCO 61 has a first input for feeding in a first voltage $V_{COARSE}$ for the coarse tuning of the VCO 61 and a second input for feeding in a second voltage $V_{FINE}$ for the fine tuning of the VCO 61. In the example illustrated, the first voltage $V_{COARSE}$ (coarse tuning voltage) is generated by a digital-to-analog converter 62 (DAC) according to a digital word $x_{COARSE}$, whereas the second voltage $V_{FINE}$ (fine tuning voltage) is output by the feedback network 60 (phase/frequency feedback of the PLL). The fine tuning voltage $V_{FINE}$ is thus an output variable of the feedback network 60 and simultaneously an input voltage of the VCO 61. The VCO 61 and the feedback network 60 together form the closed phase-locked loop (PLL). It should also be pointed out at this juncture that the DAC 62 for generating the coarse tuning voltage $V_{COARSE}$ is optional and can be omitted in some example implementations. In these cases, a coarse tuning of the VCO is not necessary or is implemented in some other way and the VCO has only one input for the fine tuning voltage $V_{FINE}$ (cf. FIG. 12 and associated description).

For each of the input voltages $V_{FINE}$, $V_{COARSE}$, it is possible to define an associated VCO gain $f_{LO}/V_{FINE}$, respectively. The derivatives $\partial f_{LO}/\partial V_{FINE}$ and $\partial f_{LO}/\partial V_{FINE}$, respectively, are referred to as differential VCO gains. In the following discussion, the ratio $f_{LO}/V_{FINE}$ is referred to as VCO gain $K_{VCO}$ and the derivative $\partial f_{LO}/\partial V_{FINE}$ is referred to as differential VCO gain $k_{VCO}$. Both values $K_{VCO}$ and $k_{VCO}$ are generally frequency-dependent. Furthermore, the VCO gain $K_{VCO}$ and the differential VCO gain $k_{VCO}$ are temperature-dependent and can also be influenced by aging effects.

Figure 6:
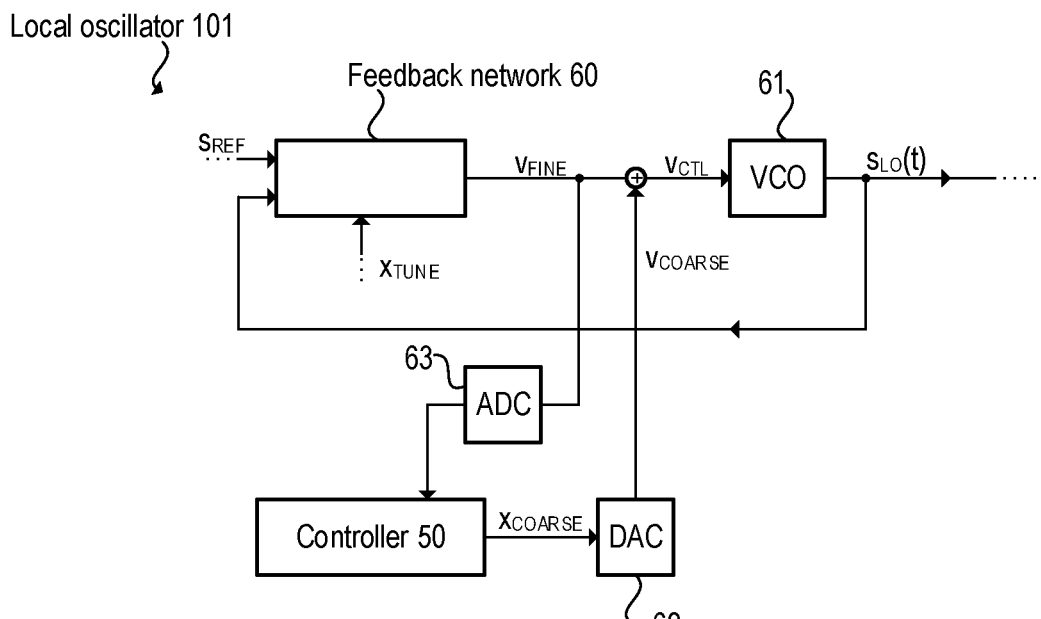
FIG. 6 is a block diagram for illustrating a second example of a local oscillator with a VCO interconnected in a phase-locked loop.

The VCO 61 used in the example from FIG. 5 thus has two VCO gains $f_{LO}/V_{COARSE}$ and $f_{LO}/V_{FINE}$. In this example, VCO 61 includes two different varactor diodes, the characteristic curves of which determine the VCO gains. Various suitable implementations of the VCO 61 are known per se and will therefore not be explained in greater detail here. FIG. 6 illustrates a further example of a local oscillator 101 having a phase-locked loop. Unlike in the previous example, in the present example the VCO 61 has only one input, to which is fed the voltage $V_{CTL}$ corresponding to the sum $V_{COARSE}+V_{FINE}$. In this case, the VCO has only one VCO gain $f_{LO}/V_{CTL}$. For the corresponding differential VCO gain $\partial f_{LO}/\partial V_{CTL}$, it holds true that $k_{VCO}=\partial f_{LO}/\partial V_{CTL}=\partial f_{LO}/\partial V_{FINE}=\partial f_{LO}/\partial V_{COARSE}$. Apart from the implementation of the VCO, the example from FIG. 6 is identical to the previous example from FIG. 5 and reference is made to the description above.

In the examples from FIGS. 5 and 6, the setpoint value for the frequency $f_{LO}$ is set firstly by the frequency $f_{REF}$ of a reference signal $s_{REF}(t)$ and secondly by adapting the division ratio of a frequency divider in the feedback network 60 of the phase-locked loop, wherein the division ratio can be adapted depending on the digital signal $x_{TUNE}$. This mechanism will be explained in even greater detail later with reference to FIG. 8. The reference signal $s_{REF}(t)$ can be generated e.g. using a clock generator (not illustrated), which can contain a crystal, for example, which defines the frequency $f_{REF}$. The frequency $f_{REF}$ of a reference signal $s_{REF}(t)$ can be e.g. in the range of a few hundred MHz (e.g. 200 MHz).

The digital signal $x_{COARSE}$ fed to the DAC 62 can be provided e.g. by the system controller 50 (cf. FIG. 3), which is a controller circuit. The feedback network 60 of the phase-locked loop is configured to set the fine tuning voltage $V_{FINE}$ such that the frequency $f_{LO}$ of the LO signal $s_{LO}(t)$ corresponds to the setpoint value (dependent on the digital signal $x_{TUNE}$). The fine tuning voltage $V_{FINE}$ can be varied only in a specific interval (e.g. 0 to 3 V). The size of this interval depends on the implementation of the VCO 61 and of the feedback network 60. According to the (frequency-dependent) differential VCO gain $k_{VCO} = \partial f_{LO}/\partial V_{FINE}$, this interval corresponds to a frequency range of e.g. 1500 MHz (frequency ramps over e.g. 200 MHz-4000 MHz are also possible), within which the frequency $f_{LO}$ of the LO signal $s_{LO}(t)$ can be adapted by varying the fine tuning voltage $V_{FINE}$. That is to say that the frequency $f_{LO}$ of the LO signal $s_{LO}(t)$ (given a suitable setting of the coarse tuning voltage $V_{COARSE}$) can be fine-tuned e.g. in the range of 76 GHz to 77.5 GHz. If a different tuning range is desired (e.g. 79 GHz to 80.4 GHz), the coarse tuning voltage $V_{COARSE}$ is to be adapted. The numerical values indicated serve merely for illustration and depend greatly on the actual implementation.

As mentioned, the VCO gain $K_{VCO}$ and the differential VCO gain $k_{VCO}$ are also temperature-dependent. In order to generate a specific sequence of frequency ramps (chirps) having a start frequency $f_1$ and a stop frequency $f_2$, firstly the coarse tuning voltage $V_{COARSE}$ can be set and subsequently the frequency $f_{LO}$ can be modulated by changing the fine tuning voltage $V_{FINE}$ from a first value $V_{FINE}=V_1$ to a second value $V_{FINE}=V_2$. This last is achieved with the aid of the phase-locked loop. In this case, the frequency $f_{LO}$ generated by the VCO 61 changes from the start frequency $f_1$ to the stop frequency fz. The modulation of the frequency $f_{LO}$ is not achieved directly by changing the fine tuning voltage $V_{FINE}$. The controller 50 can change the effective division ratio of the frequency divider 66 (see also FIG. 8) by changing the (digital) signal $x_{TUNE}[n]$, which in turn results in a change in the frequency $f_{PLL}$ fed back in the phase-locked loop; this change can be compensated for by the feedback by virtue of the fine tuning voltage $V_{FINE}$ being readjusted (using phase detector, charge pump and loop filter). In the settled state of the PLL, the frequency $f_{LO}$ is dependent only on the usually constant reference frequency $f_{REF}$ and the effective division ratio of the frequency divider 66 (see also FIG. 8), which can be set by way of the signal $x_{TUNE}[n]$. The present value of the fine tuning voltage $V_{FINE}$ arises as it were "automatically" as output signal of the PLL and is additionally dependent on the temperature-dependent VCO gain and the presently set value of the coarse tuning voltage $V_{COARSE}$.

The temperature dependence of the VCO gain $K_{VCO}$ can be taken into account in the coarse tuning of the VCO in order to ensure that the voltage range from $V_1$ to $V_2$ that is necessary for a desired frequency ramp (from $f_1$ to $f_2$) does not leave the interval (e.g. 0 to 3 V) within which the voltage $V_{FINE}$ can be varied. By way of example, for a given value of the coarse tuning voltage $V_{COARSE}$ and a desired frequency ramp (e.g. $f_1=76$ GHz and $f_2=77.5$ GHz), it may be beneficial to vary the fine tuning voltage $V_{FINE}$ from $V_1=0.6$ V to $V_2=2.7$ V. As a result of a temperature change, $V_1$ and $V_2$ may shift by e.g. 0.5 V. However, the voltage value $V_2=2.7$ V+0.5 V lies outside the fine tuning range. An adaptation of the coarse tuning voltage $V_{COARSE}$ is thus useful.

In order to avoid an adaptation of the coarse tuning voltage $V_{COARSE}$ in the course of operation, the coarse tuning can be carried out such that for the start frequency $f_1$ of a frequency ramp, the fine tuning voltage $V_{FINE}$ assumes a predefined setpoint value (independently of the present temperature). In the case of a frequency ramp with rising frequency (up-chirp), e.g. during a tuning phase, the coarse tuning voltage $V_{COARSE}$ can be varied until the fine tuning voltage $V_{FINE}$ assumes a defined setpoint value of e.g. $V_1=0.6$ V. In this case, the fine tuning voltage $V_{FINE}$ can be measured using an ADC 63 and the resulting digital value can be fed to the controller 50. In the case of a frequency ramp with falling frequency, the setpoint value for the fine tuning voltage $V_{FINE}$ can be higher, e.g. $V_2=2.4$ V.

Figure 7:
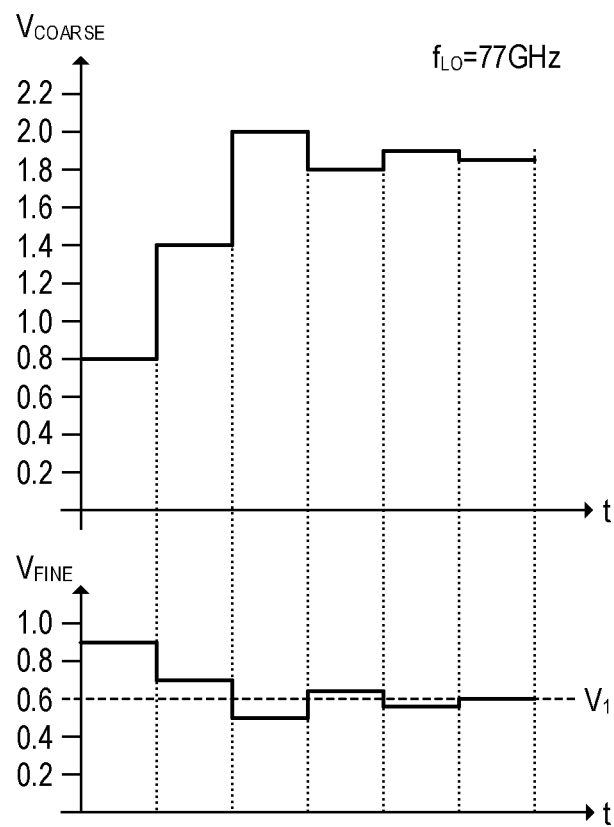
FIG. 7 shows, in an example timing diagram, a concept for iteratively setting the voltage for coarse tuning of the VCO.

The variation of the coarse tuning voltage $V_{COARSE}$ can be carried out e.g. using known iteration methods, e.g. using successive approximation (see FIG. 7). While the coarse tuning voltage $V_{COARSE}$ is being iteratively adapted, the phase-locked loop is active; the feedback network 60 of the phase-locked loop readjusts the fine tuning voltage $V_{FINE}$, such that during this tuning phase the LO frequency $f_{LO}$ remains substantially constant (apart from short, transient variations).

In accordance with the example illustrated in FIG. 7, the voltage $V_{COARSE}$ is firstly set to an initial value of e.g. 0.8 V. The feedback network 60 then regulates the voltage $V_{FINE}$ to a value (e.g. 0.9 V), such that the frequency $f_{LO}$ corresponds to the desired frequency $f_1$. This value of the voltage $V_{FINE}$ is greater than the desired setpoint value $V_1$, for which reason the voltage $V_{COARSE}$ is successively increased. On account of the feedback in the phase-locked loop, as a result the voltage $V_{FINE}$ falls to below the setpoint value $V_1$, for which reason the voltage $V_{COARSE}$ is reduced again (by a reduced voltage swing) until the voltage $V_{FINE}$ rises again above the setpoint value $V_1$, etc. The voltage $V_{FINE}$ is thus successively approximated to the setpoint value $V_1$. The associated coarse tuning voltage $V_{COARSE}$ arises "automatically" as a result of the successive approximation. At the end of the tuning phase, $V_{FINE} \approx V_1$ holds true, wherein the setpoint value $V_1$ is no longer dependent (or is only very weakly dependent) on the temperature. The temperature dependence and other cross-sensitivities are compensated for by the iterative adaptation of the coarse tuning voltage $V_{COARSE}$. Successive approximation is an iteration method known per se and will therefore not be discussed any further here. Other methods for setting the coarse tuning voltage $V_{COARSE}$ are also possible.

Figure 8:
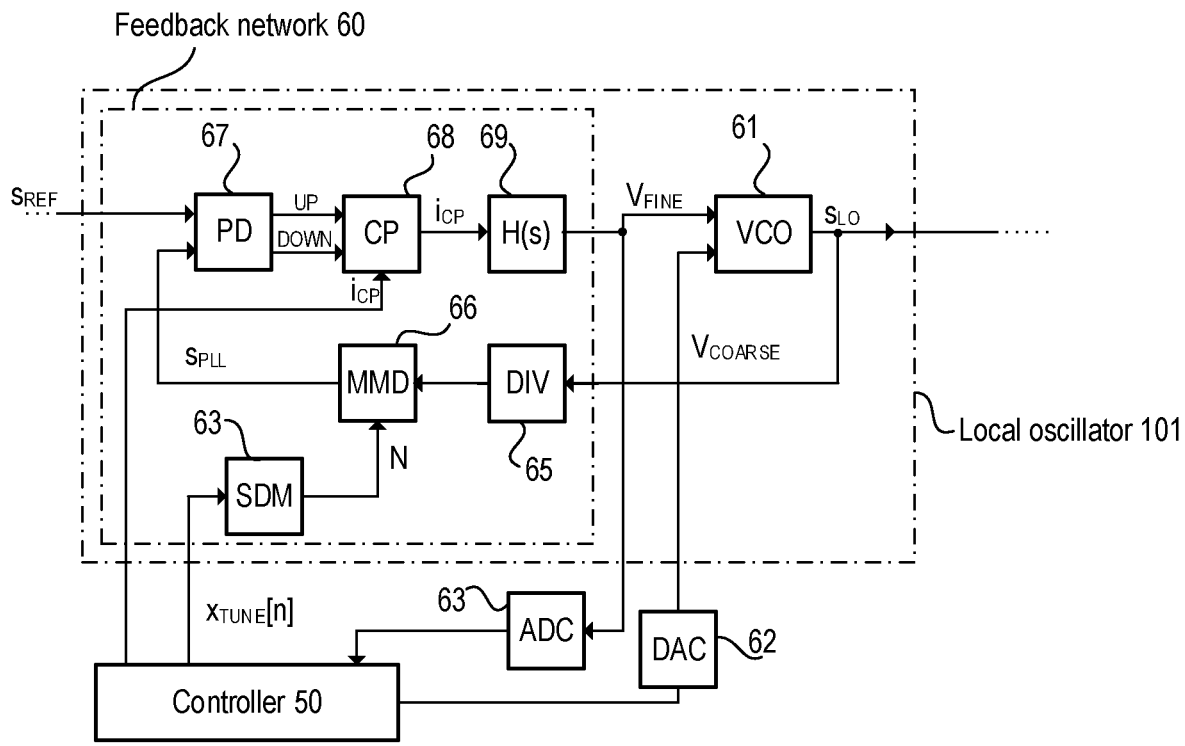
FIG. 8 illustrates one example implementation of the phase-locked loop from FIG. 5 in greater detail, wherein the bandwidth of the phase-locked loop can be set by changing the absolute value of the output current of the charge pump.

FIG. 8 shows one example of an implementation of the phase-locked loop (PLL) in greater detail. In the example illustrated, the feedback network 60 of the phase-locked loop comprises a frequency divider 65 having a fixed division ratio M and a multi-modulus divider 66 (MMD) having a settable (integral) division ratio N. The total division ratio is accordingly N·M. The division ratio N can be varied e.g. using a sigma-delta modulator 63, such that a non-integral division ratio R is effectively attained, which is substantially determined by the digital signal $x_{TUNE}$ fed as input signal to the sigma-delta modulator 63. The combination of multi-modulus divider 66 and sigma-delta modulator 63 is known per se as "fractional-N divider" and will therefore not be explained in greater detail here. It should be noted at this juncture that the frequency divider 65 having a fixed division ratio is optional (e.g. the fixed division ratio M can be 1). Furthermore, the order of the frequency dividers 65 and 66 can be interchanged.

In the example illustrated, the output signal of the MMD 66 is designated by $s_{PLL}(t)$. This output signal $s_{PLL}(t)$ has a frequency $f_{PLL}$, and the ratio $f_{LO}/f_{PLL}$ corresponds to the effective division ratio $R=M \cdot x_{TUNE}[n]$ of the two frequency dividers 65 and 66. In a phase detector (also called phase frequency detector) 67, the frequency $f_{PLL}$ is compared with the frequency $f_{REF}$ of a reference signal $s_{REF}(t)$ (clock signal). The output signal of the phase frequency detector 67 is dependent on the result of the comparison and drives a charge pump 68, the output current $i_{CP}$ of which depends on whether frequency and phase of the signal $s_{PLL}(t)$ and of the reference signal $s_{REF}(t)$ deviate from one another (see FIG. 9 and the associated description). The output current $i_{CP}$ is fed to the so-called loop filter 69, which finally provides the fine tuning voltage $V_{FINE}$ according to a transfer function H(s). The structure and the functioning of the phase-locked loop for generating a frequency-modulated RF signal is known per se and will therefore not be explained in greater detail here. Unlike in prior implementations, however, the bandwidth of the phase-locked loop can be changed, for example by adapting the absolute value of the output current $i_{CP}$ of the charge pump 68.

For the following discussion, the coarse tuning voltage $V_{COARSE}$ is assumed to be constant and the differential VCO gain $k_{VCO}$ is defined as aka $\partial f_{LO}/\partial V_{FINE}$. The open-loop transfer function L(s) of the phase-locked loop can be specified as follows:

$$L(s) = \frac{1}{s} \frac{k_{VCO} \cdot i_{CP0}}{R} H(s) \quad (1)$$

wherein $i_{CP}$ is the absolute value of the output current of the charge pump 68. By way of example, the output current $i_{CP}$ can be equal to $+i_{CP0}$ or $-i_{CP0}$ depending on the output signal of the phase frequency detector 67 (cf. FIG. 9).

The closed-loop transfer function G(s) of the phase-locked loop can be calculated as follows:

$$G(s) = \frac{L(s)}{1 + L(s)}. \quad (2)$$

The bandwidth of the closed-loop transfer function G(s) is dependent firstly on the parameters $k_{VCO}$ (differential VCO gain), $i_{CP0}$ (absolute value of the charge pump output current) and R (real division ratio $f_{PLL}/f_{LO}$), and also on the transfer function H(s) of the loop filter 68.

Figure 9:
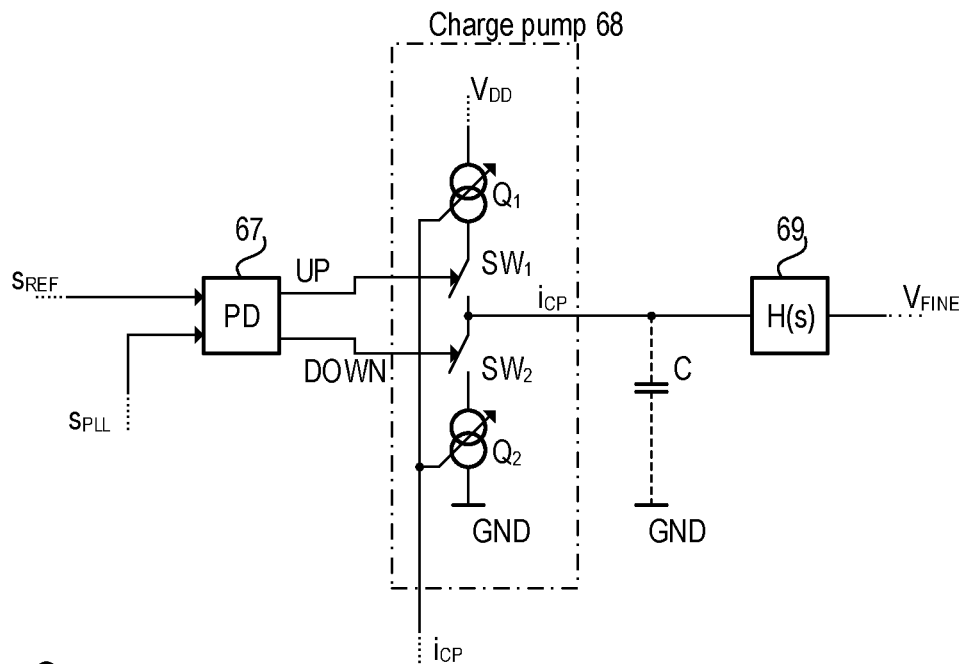
FIG. 9 illustrates one example implementation of a charge pump that can be used in the phase-locked loop in accordance with FIG. 8.

FIG. 9 shows a simple example of a charge pump 68. The latter comprises a current source $Q_1$ and a second current sink $Q_2$ and also a first switch $SW_1$ and a second switch $SW_2$. The switch $SW_1$ connects the current source $Q_1$ to an output node of the charge pump 68, and the switch $SW_2$ connects the current sink $Q_2$ to the output node. A capacitor C is coupled to the output node, the capacitor being configured to store the charge supplied by the current source $Q_1$ or the current sink $Q_2$. The voltage $V_{CP}$ across the capacitor C is proportional to the stored charge. The switches $SW_1$ and $SW_2$ of the charge pump 68 are driven by the output signals UP, DOWN, which e.g. are generated as output signals by the phase detector 67 (see FIG. 8) or are derived from the output signal thereof. If the phase of the signal $s_{PLL}(t)$ is less than the phase of the reference signal $s_{REF}(t)$, then the switch $SW_1$ is switched on (for a specific on time $T_{ON1}$) by the signal UP (generated by the phase detector 67) and the output current $i_{CP}$ of the charge pump is $+i_{CP0}$; the associated charge is $i_{CP0} \cdot T_{ON1}$. Equally, if the phase of the signal $s_{PLL}(t)$ is greater than the phase of the reference signal $s_{REF}(t)$, the switch $SW_2$ is switched on (for a specific on time $T_{ON2}$) by the signal DOWN (generated by the phase detector 67) and the output current $i_{CP}$ of the charge pump is $-i_{CP0}$; the associated charge is $-i_{CP0} \cdot T_{ON2}$. The on times $T_{ON1}$ and $T_{ON2}$ can be proportional to the respective phase difference (between $s_{PLL}(t)$ and $s_{REF}(t)$). The loop filter 69 filters the resulting voltage signal $V_{CP}$; the filtered signal is the fine tuning voltage $V_{FINE}$.

The structure and the function of the charge pump 68 are known per se and will therefore not be explained any further here. Unlike in prior implementations, the current source $Q_1$ and the current sink $Q_2$ are controllable, e.g. the absolute value $i_{CP0}$ of the output current is settable. As already explained above, the bandwidth of the phase-locked loop is dependent on the absolute value $i_{CP0}$ of the output current of the charge pump. As mentioned, the bandwidth of the phase-locked loop influences the phase noise contained in the LO signal $s_{LO}(t)$, the phase noise influencing the background noise of the radar system and thus also the detectability of radar targets and the reliability of the detection. A radar sensor usually has to fulfill specific specifications with regard to the phase noise. However, the actual absolute current value $i_{CP0}$ can deviate from a desired setpoint value on account of tolerances during the production of the integrated charge pump circuit. Furthermore, the absolute current value $i_{CP0}$ can fluctuate on account of temperature changes.

Figure 10:
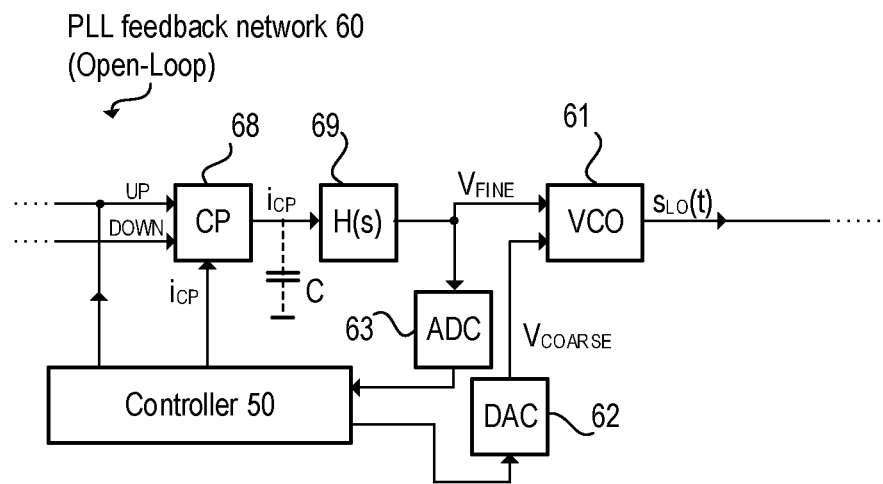
FIG. 10 shows a part of the phase-locked loop (open control loop) that is used for the measurement of the output current of the charge pump of the phase-locked loop.

A concept is explained below which makes it possible, in the chip in which the local oscillator 101 is integrated (e.g. in the MMIC in which the RF frontend of the radar transceiver is integrated), to ascertain the absolute current value $i_{CP0}$ using measurements and to calibrate it on the basis of these measurements. FIG. 10 illustrates that part of the feedback network 60 of the phase-locked loop from FIG. 8 which is used for the measurement. The control loop is open during the measurement, that is to say that no feedback of the LO frequency $f_{LO}$ to the phase detector 67 takes place, and the charge pump 68 is driven directly by the controller 50 (and the output of the phase detector is ignored). The functioning of the circuit from FIG. 10 during measurement operation is explained below with reference to the timing diagrams from FIG. 11. Firstly, the coarse tuning voltage $V_{COARSE}$—with the phase-locked loop being closed—can be adapted such that the fine tuning voltage $V_{FINE}$ assumes a defined output value $V_0$. The method explained with reference to FIG. 7 can be used for this purpose. However, the concrete value of $V_0$ is not important for the subsequent steps and, therefore, the (e.g. iterative) adaptation of the coarse tuning voltage $V_{COARSE}$ can also be omitted and the coarse tuning voltage $V_{COARSE}$ can be set to a predefined value.

In the next step, the controller 50—e.g. with the phase-locked loop being open—causes the charge pump 68 to output as output signal $i_{CP}(t)$ a first current pulse having a defined pulse length $T_{ON}=t_2-t_1$ and a defined first amplitude $i_{CP0}$. A current pulse of this type is illustrated in the right-hand diagram in FIG. 11 (dashed line, current amplitude $i_{CP0}$). As a reaction to the first current pulse, the fine tuning voltage $V_{FINE}$ rises by a first voltage difference $\Delta V_1 (V_1=V_0+\Delta V_1)$. This voltage difference $\Delta V_1$ can be calculated (for a settled state) as follows:

$$\Delta V_1 = \frac{1}{C} \int_{t_1}^{t_2} i_{CP}(t) dt = \frac{1}{C} i_{CP0} T_{ON}, \quad (3)$$

wherein C denotes the effective capacitance at the output of the charge pump 68 (and thus also at the input of the loop filter 69). The response of the fine tuning voltage $V_{FINE}$ to the first current pulse is illustrated in the left-hand diagram in FIG. 10 (dashed signal profile). The effective capacitance C is that capacitance which the charge pump 68 "sees" at its output. In the settled state (e.g. once all transient processes have decayed), the loop filter 68 behaves like a capacitive element and can thus be regarded as a capacitance C representing the sum of all individual capacitances in the loop filter (e.g. between charge pump and VCO).

Afterward, a second measurement is also carried out, wherein the charge pump 68 is driven such that a second current pulse having the defined pulse length $T_{ON}$ and a defined second amplitude $i_{CP0}+\Delta i$ is output as output signal $i_{CP}(t)$. In the example illustrated in FIG. 11, before the second measurement, the fine tuning voltage $V_{FINE}$ is set once again to the value $V_{FINE}=V_0$ by adaptation of the coarse tuning voltage $V_{COARSE}$ (cf. FIG. 7), although this is not necessary (cf. FIG. 12). As a reaction to the second current pulse, the fine tuning voltage $V_{FINE}$ rises by a second voltage difference $\Delta V_2$ ($V_2=V_0+\Delta V_2$). This voltage difference $\Delta V_2$ can be calculated as follows $$\Delta V_2 = \frac{1}{C}\int_{t_1}^{t_2} i_{CP}(t)dt = \frac{1}{C}(i_{CP0} + \Delta i)T_{ON}. \tag{4}$$

The response of the fine tuning voltage $V_{FINE}$ to the second current pulse is illustrated in the left-hand diagram in FIG. 10 (solid signal profile). For both measurements, the reaction of the voltage $V_{FINE}$ is measured e.g. using the analog-digital converter 63. The controller 50 can ascertain the voltage differences $\Delta V_1$ and $\Delta V_2$ on the basis of the change in the (digitized) voltage $V_{FINE}$.

From the voltage differences $\Delta V_1$ and $\Delta V_2$ it is possible with known amplitude difference $\Delta i$—to calculate the first amplitude $i_{CP0}$. For this purpose, the ratio $\Delta V_2/\Delta V_1$ can be calculated:

$$\frac{\Delta V_2}{\Delta V_1} = (i_{CP0} + \Delta i)/i_{CP0} = 1 + \Delta i/i_{CP0}, \tag{5}$$

and from the ratio $\Delta V_2/\Delta V_1$ rearrangement of equation 5 gives $$\Delta i = i_{CP0}\left(\frac{\Delta V_2}{\Delta V_1} - 1\right), \text{ and} \tag{6}$$

$$i_{CP0} = \frac{\Delta i}{\frac{\Delta V_2}{\Delta V_1} - 1} = \frac{\Delta i \cdot \Delta V_1}{\Delta V_2 - \Delta V_1}. \tag{7}$$

The calculations used for the evaluation of equation 7 can be carried out e.g. by a computing unit (e.g. a processor, a microcontroller, a CPU, etc.) contained in the controller 50.

Optionally, the effective capacitance C can be ascertained from the voltage differences $\Delta V_1$ and $\Delta V_2$. The capacitance C follows directly from the difference $\Delta V_2-\Delta V_1$, in accordance with the following equations $$\Delta V_2 - \Delta V_1 = \frac{1}{C}T_{ON}\Delta i \tag{8}$$

$$C = \frac{T_{ON}\Delta i}{\Delta V_2 - \Delta V_1}. \tag{9}$$

Figure 11:
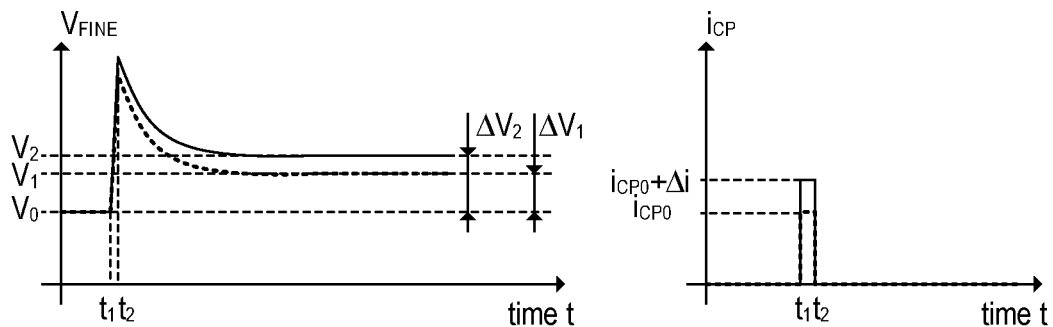
FIG. 11 shows, in example timing diagrams, the response of the input voltage at the VCO to one current pulse of the charge pump of the phase-locked loop for different peak values of the current pulses.
Figure 12:
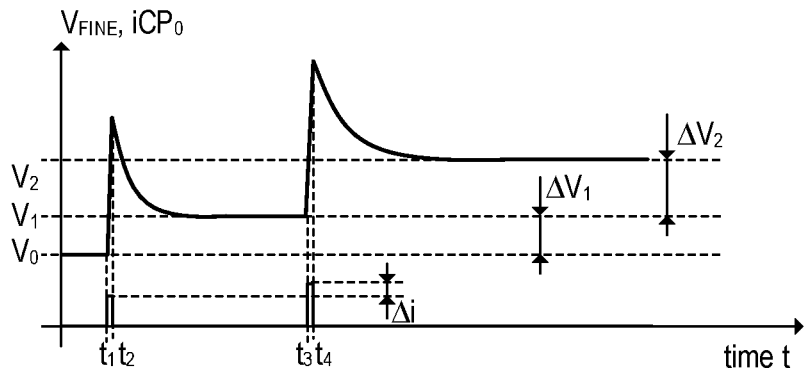
FIG. 12 is an example timing diagram illustrating an alternative approach to FIG. 11.

The example from FIG. 12 differs from the example from FIG. 11 merely in that, before the second current pulse, the fine tuning voltage is not reset again to $V_0$. In this example, the coarse tuning of the VCO, that is to say the setting of the operating point of the VCO, can be obviated. The voltage differences $\Delta V_1$ and $\Delta V_2$ are not appreciably dependent on the output voltage $V_0$, however, such that the ascertaining of the first amplitude $i_{CP0}$ does not change in the example in FIG. 12. For the pulse length of the current pulses from FIG. 12 it holds true that $T_{ON}=t_2-t_2=t_4-t_3$.

Figure 13:
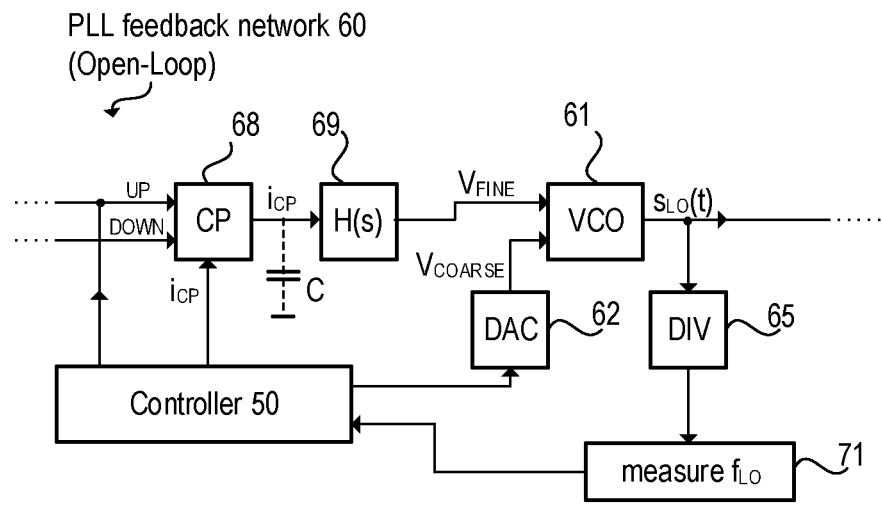
FIGS. 13 and 14 show an alternative to FIGS. 10 and 11, respectively.
Figure 14:
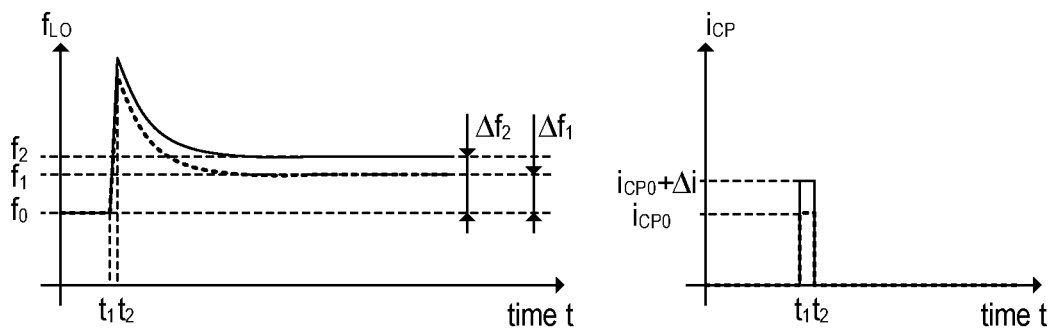

FIGS. 13 and 14 show an alternative to the example in accordance with FIGS. 10 and 11. The circuit in accordance with the example from FIG. 13 is substantially identical to the circuit in accordance with the example from FIG. 10 apart from the fact that the voltage measurement using the ADC 63 is replaced by a frequency measurement (see FIG. 13, frequency measuring circuit 71). Since a change in the voltage $V_{FINE}$ at the VCO input and a change in the frequency $f_{LO}$ are related directly by way of the differential VCO gain $k_{VCO}$, the functions of the circuits from FIGS. 10 and 13 are substantially equivalent. The following approximation holds true for the differential VCO gain:

$$k_{VC0} = \frac{\partial f_{LO}}{\partial V_{FINE}} \approx \frac{\Delta f_1}{\Delta V_1} \approx \frac{\Delta f_2}{\Delta V_2}, \tag{10}$$

and the voltage differences $\Delta V_1$ and $\Delta V_2$ in equations 7 and 9 can thus be expressed as follows:

$$\Delta V_1 = \Delta f_1/k_{VCO} \text{ and } \Delta V_2 = \Delta f_2/k_{VCO}. \tag{11}$$

A substitution of $\Delta V_1$ and $\Delta V_2$ (in accordance with equation 11) in equation 7 yields (constant $k_{VCO}$ cancels out)

$$i_{CP0} = \frac{\Delta i}{\frac{\Delta f_2}{\Delta f_1} - 1} = \frac{\Delta i \cdot \Delta f_1}{\Delta f_2 - \Delta f_1}, \tag{12}$$

and a substitution of $\Delta V_1$ and $\Delta V_2$ in equation 9 yields $$C = \frac{k_{VCO}T_{ON}\Delta i}{\Delta f_2 - \Delta f_1} \tag{13}$$

For a calculation of the capacitance (equation 13), the VCO gain $k_{VCO}$ in the frequency range under consideration has to be known or likewise measured. However, the VCO gain $k_{VCO}$ does not influence the calculation of the first amplitude $i_{CP0}$ sought (equation 12). The right-hand diagram in FIG. 14 shows the same current pulses as FIG. 11. The left-hand diagram in FIG. 14 shows the reaction of the LO frequency $f_{LO}$ to the first current pulse; e.g. the LO frequency $f_{LO}$ rises by a first frequency difference $\Delta f_1$ ($f_1=f_0+\Delta f_1$) as a reaction to the first current pulse having the amplitude $i_{CP0}$ and by a second frequency difference $\Delta f_2$ ($f_2=f_0+\Delta f_2$) as a reaction to the second current pulse having the amplitude $i_{CP0}+\Delta i$. Between the measurements the output frequency $f_{LO}$ of the VCO can be regulated again to the output value $f_0$ (frequency $f_0$ corresponds to a voltage $V_{FINE}=V_0$, cf. FIG. 7). Alternatively, the frequency can be increased in a stepwise manner—analogously to the example from FIG. 12. That is possible provided that the VCO gain $k_{VCO}$ does not change appreciably between the values $f_0$ and $f_2$. That is usually the case in practice since only small frequency changes are considered. Furthermore, the measurement can be carried out in a frequency range in which the change $\partial k_{VCO}/\partial f$ in the VCO gain $k_{VCO}$ is comparatively small. The frequency measurement can be carried out using a counter, for example, which counts the periods of the LO signal (e.g. following a frequency division by frequency divider 65, see FIG. 13) within a specific time window. This and other techniques for frequency measurement are known per se and will therefore not be explained in greater detail here.

The measurement of the first amplitude $i_{CP0}$ makes possible an offset correction. Assuming that the measurement value for $i_{CP0}$ deviates from a desired setpoint value $i_{CP,D}$ by an offset $i_{OF}$ ($i_{CP0}=i_{CP,D}+I_{OF}$), then the controller 50 can drive the charge pump such that the amplitude of the current pulses is smaller than in the preceding measurement by the value $i_{OF}$, as a result of which the offset error is corrected ($i_{OF}$ can also be negative).

Figure 15:
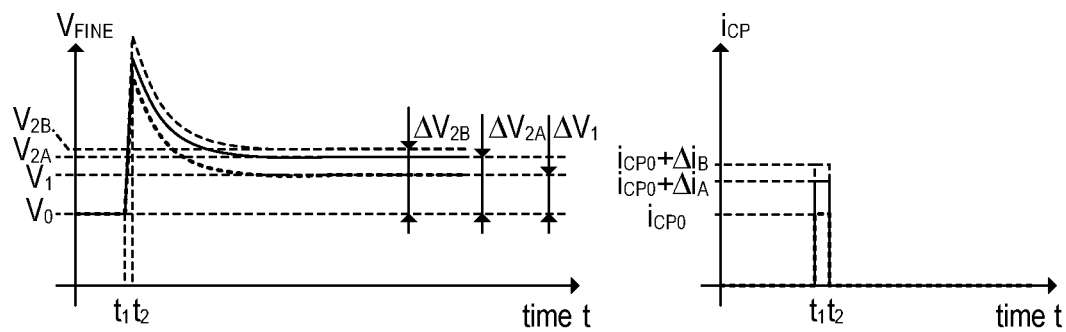
FIG. 15 shows, in example timing diagrams, the responses of the input voltage at the VCO to a plurality of current pulses of the charge pump of the phase-locked loop for different peak values of the current pulses.

FIG. 15 shows, on the basis of example timing diagrams, the repeated performance of measurements from FIG. 11. In this case, in a first measurement, the charge pump is operated again with a current amplitude $i_{CP0}$; a (changed) current amplitude $i_{CP0}+\Delta i_A$ is set in a second measurement and a current amplitude $i_{CP0}+\Delta i_B$ is set in a third measurement. The resulting voltage changes are designated by $\Delta V_1$ (in the case of a current amplitude $i_{CP0}$), $\Delta V_{2A}$ (in the case of a current amplitude $i_{CP0}+\Delta i_A$) and $\Delta V_{2B}$ (in the case of a current amplitude $i_{CP0}+\Delta i_B$). Analogously to equation (7), the following is obtained (with $\Delta i=\Delta i_A$ and $\Delta V_2=\Delta V_{2A}$)

$$i_{CP0} = \frac{\Delta i_A}{\frac{\Delta V_{2A}}{\Delta V_1}-1} = \frac{\Delta i_A \cdot \Delta V_1}{\Delta V_{2A}-\Delta V_1}, \text{ and} \quad (14)$$

$$i_{CP0} = \frac{\Delta i_B}{\frac{\Delta V_{2B}}{\Delta V_1}-1} = \frac{\Delta i_B \cdot \Delta V_1}{\Delta V_{2B}-\Delta V_1}. \quad (15)$$

Since both equations 14 and 15 yield the same result, it holds true that:

$$\Delta i_A = \Delta i_B \frac{\Delta V_1}{\Delta V_{2A}-\Delta V_1} = \Delta i_B \frac{\Delta V_1}{\Delta V_{2B}-\Delta V_1}. \quad (16)$$

Under the assumption of amplitude differences $\Delta i_A$ and $\Delta i_B$ exhibiting errors (constant error $\Delta i_{ERR}$)

$$\Delta i_A = \Delta i_{AD} + \Delta i_{ERR}, \text{ and } \Delta i_B = \Delta i_{BD} + \Delta i_{ERR}, \quad (17)$$

that is to say that the amplitude differences $\Delta i_A$ and $\Delta i_B$ deviate from the associated setpoint values $\Delta i_{AD}$ and $\Delta i_{BD}$ in each case by an error $\Delta i_{ERR}$, it follows from equation 16 that:

$$(\Delta i_{AD} + \Delta i_{ERR})K_A = (\Delta i_{BD} + \Delta i_{ERR})K_B, \text{ where} \quad (18)$$

$$K_A = \frac{\Delta V_1}{\Delta V_{2A}-\Delta V_1} \text{ and } K_B = \frac{\Delta V_1}{\Delta V_{2B}-\Delta V_1}. \quad (19)$$

The parameters $K_A$ and $K_B$ here represent the measurement values $\Delta V_1$, $\Delta V_{2A}$ and $\Delta V_{2B}$. The error $\Delta i_{ERR}$ follows from equation 18:

$$\Delta i_{ERR} = (\Delta i_{BD}K_B - \Delta i_{AD}K_A)/(K_A - K_B) \quad (20)$$

An additional measurement with a changed amplitude difference ($\Delta i_B$ instead of $\Delta i_A$) makes it possible to determine the current error (differential error) $\Delta i_{ERR}$. As an alternative to the above calculation from equation 18, it is also possible to receive a constant percentage error. In this case, the following relationship is obtained instead of equation 18:

$$(\Delta i_{AD}(1+p/100))K_A=(\Delta i_{BD}(1+p/100))K_A, \quad (21)$$

with the percentage error p. Rearrangement of equation 21 gives $$p = 100\frac{(\Delta i_{BD}K_B - \Delta i_{AD}K_A)}{(\Delta i_{AD}K_A - \Delta i_{BD}K_B)}. \quad (22)$$

For small (percentage) errors it holds true that $\Delta i_{ERR} \approx \Delta i_{AD}(1+p/100) \approx \Delta i_{BD}(1+p/100)$ and both approaches lead to practically identical results. The measured differential error $\Delta i_{ERR}$ likewise allows a correction of the output current of the charge pump 68 (see FIG. 10), e.g. using a suitable driving of the charge pump 68 by the controller 50.

Finally, it should also be noted that the determination of the actual values of the current amplitude $i_{CP0}$, of the differential current error $\Delta i_{ERR}$ and/or of the effective capacitance C (cf. equation 13) also allows conclusions to be drawn with regard to other components that were produced in the same manufacturing process. By way of example, it is possible to establish at what end of the tolerance range a specific MMIC lies, which may represent useful information with respect to the functional reliability of the MMIC. In particular, the calculation of the effective capacitance C in accordance with equation 13 also allows the determination of the actual absolute error $\Delta C$ (or of the relative error $\Delta C/C_0$) in relation to a nominal value $C_0$ of the effective capacitance C. The information about the error $\Delta C$ (or $\Delta C/C_0$) also allows conclusions to be drawn about the actual absolute or relative error of other components in the same MMIC. In some example implementations, these errors can be e.g. partly compensated for. By way of example, the loop filter 69 can comprise switchable capacitor groups, the total capacitance of which can be set using a digital signal. In this case, a measured error $\Delta C$ can be at least partly calibrated e.g. by the driving of one or more digital capacitor groups. Furthermore, the current error of the current sources $Q_1$ and $Q_2$ of the charge pump 68 can correlate with the error $\Delta C$. This error, too, can be at least partly compensated for on the basis of the measured error $\Delta C$ e.g. by tuning resistances on which the current of the current sources $Q_1$ and $Q_2$ is dependent. By way of example, on the basis of characteristics of the manufacturing process, it may be known that an error $\Delta C/C_0$ of −10 percent results in a corresponding error of the current source current of +10 percent, which can be at least partly compensated for by corresponding tuning of the current sources $Q_1$ and $Q_2$.

Some of the example implementations described here are summarized below with reference to flow diagrams. This is not a complete enumeration, but rather only an example summary of various aspects. In accordance with the flow diagram from FIG. 16, one example implementation of the method described above (see e.g. FIGS. 10 to 14) comprises generating current pulses having a settable current amplitude and a defined duration $T_{ON}$ using a charge pump (see e.g. FIGS. 10 and 13, charge pump 68). In this case, generating current pulses comprises generating a first current pulse having a first current amplitude $i_{CP0}$ and generating a second current pulse having a second current amplitude $i_{CP0}+\Delta i$ (see FIG. 16, block 91). The difference between the first and second amplitudes is thus $\Delta i$ (see also FIG. 11, right-hand diagram). The method furthermore comprises converting (see FIG. 16, block 92) the current pulses into a tuning voltage $V_{FINE}$ for an RF oscillator (see e.g. FIGS. 10 and 13, VCO 61). In this case, the tuning voltage $V_{FINE}$ (e.g. proceeding from a settable initial value $V_0$) changes as a reaction to the current pulses depending on the amplitude thereof (see e.g. FIG. 11, left-hand diagram). In the present example, the RF oscillator is a VCO, the frequency $f_{LO}$ of which is dependent on the tuning voltage $V_{FINE}$.

Figure 16:
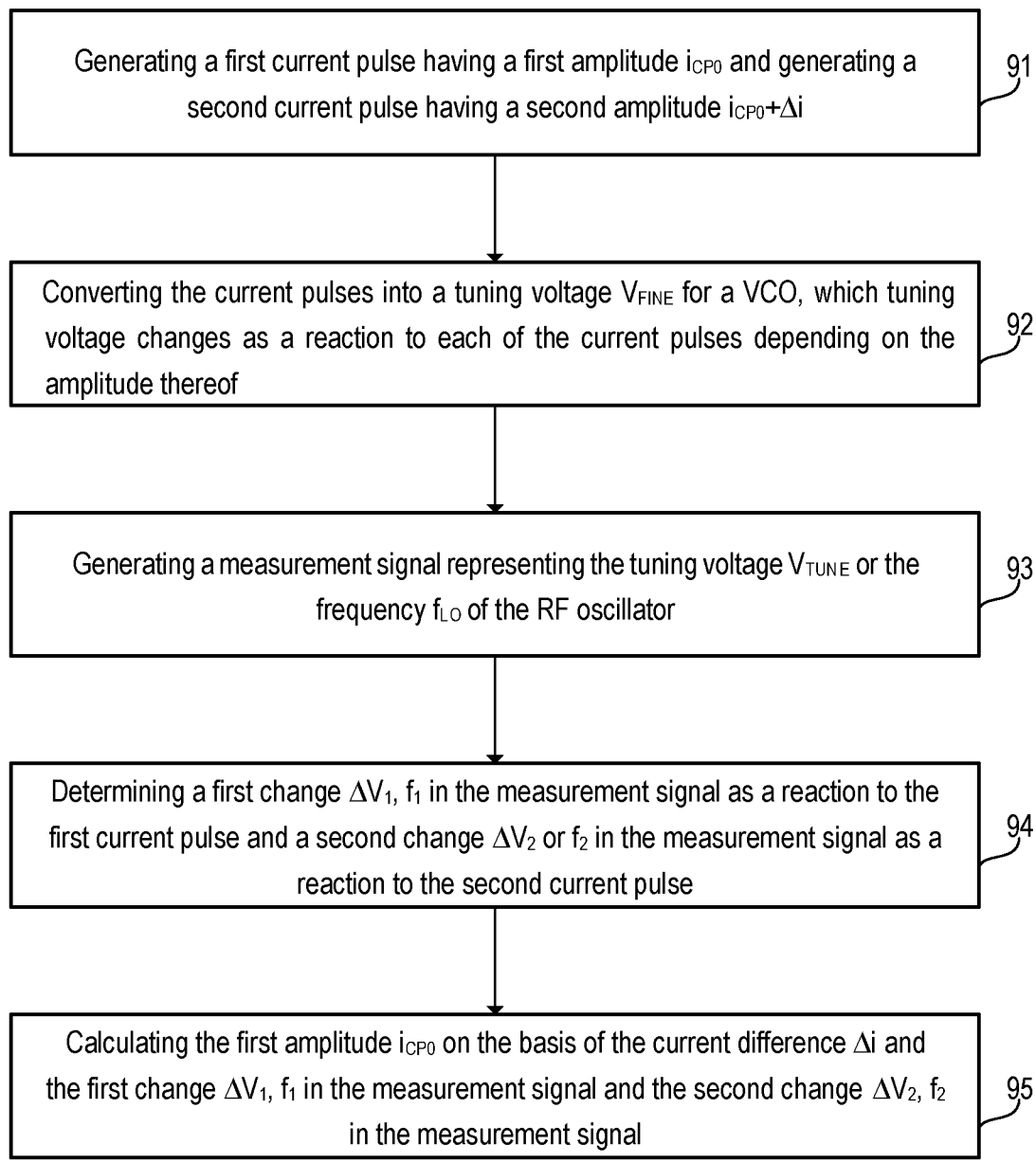
FIG. 16 is a flow diagram for illustrating one example of the method described here.

In accordance with FIG. 16, the method furthermore comprises generating a measurement signal representing the tuning voltage $V_{FINE}$ or the frequency $f_{LO}$ of the RF oscillator (see FIG. 16, block 93). The measurement signal can be e.g. the digital output signal of the ADC 63 from FIG. 10. The measurement values are designated e.g. by $V_1$ and $V_2$ in FIG. 11, and by $f_1$ and $f_2$ in FIG. 14. Furthermore, a first change $\Delta V_1$ and $\Delta f_1$, respectively, in the measurement signal as a reaction to the first current pulse (having the current amplitude $i_{CP0}$) and also a second change $\Delta V_2$ and $\Delta f_2$, respectively, in the measurement signal as a reaction to the second current pulse (having the current amplitude $i_{CP0}+\Delta i$) are determined (see FIG. 16, block 94). Determining the changes can be effected e.g. digitally in a computing unit contained in the controller 50. The first current amplitude $i_{CP0}$ can be calculated on the basis of the current amplitude difference $\Delta i$ and also the first change $\Delta V_1$ and $\Delta f_1$, respectively, and the second change $\Delta V_2$ and $\Delta f_2$, respectively (see FIG. 16, block 95). This calculation can be carried out e.g. in accordance with equation 7 or 11.

In accordance with one example implementation, the abovementioned RF oscillator and the charge pump are part of a phase-locked loop (see e.g. FIG. 10 or 13), wherein the phase-locked loop is inactive (e.g. the control loop is open) during the method described with reference to FIG. 16, such that the charge pump is driven independently of the frequency $f_{LO}$ of the RF signal (no feedback).

Before a current pulse is generated, the tuning voltage $V_{FINE}$ can be set to an initial value $V_0$. In this case, the operating point of the RF oscillator is set using a further tuning voltage $V_{COARSE}$ such that the tuning voltage $V_{FINE}$ assumes the desired value (cf. FIG. 7). During this setting of the operating point, the phase-locked loop is closed, e.g. in closed-loop operation.

In accordance with one example implementation, the abovementioned process of converting the current pulses into the tuning voltage $V_{FINE}$ for the RF oscillator can comprise feeding the current pulses to an input of a loop filter (see e.g. FIG. 10, loop filter 69) having a total capacitance (cf. FIG. 9, capacitance C), and transferring the charges transported by the current pulses to the total capacitance.

Figure 17:
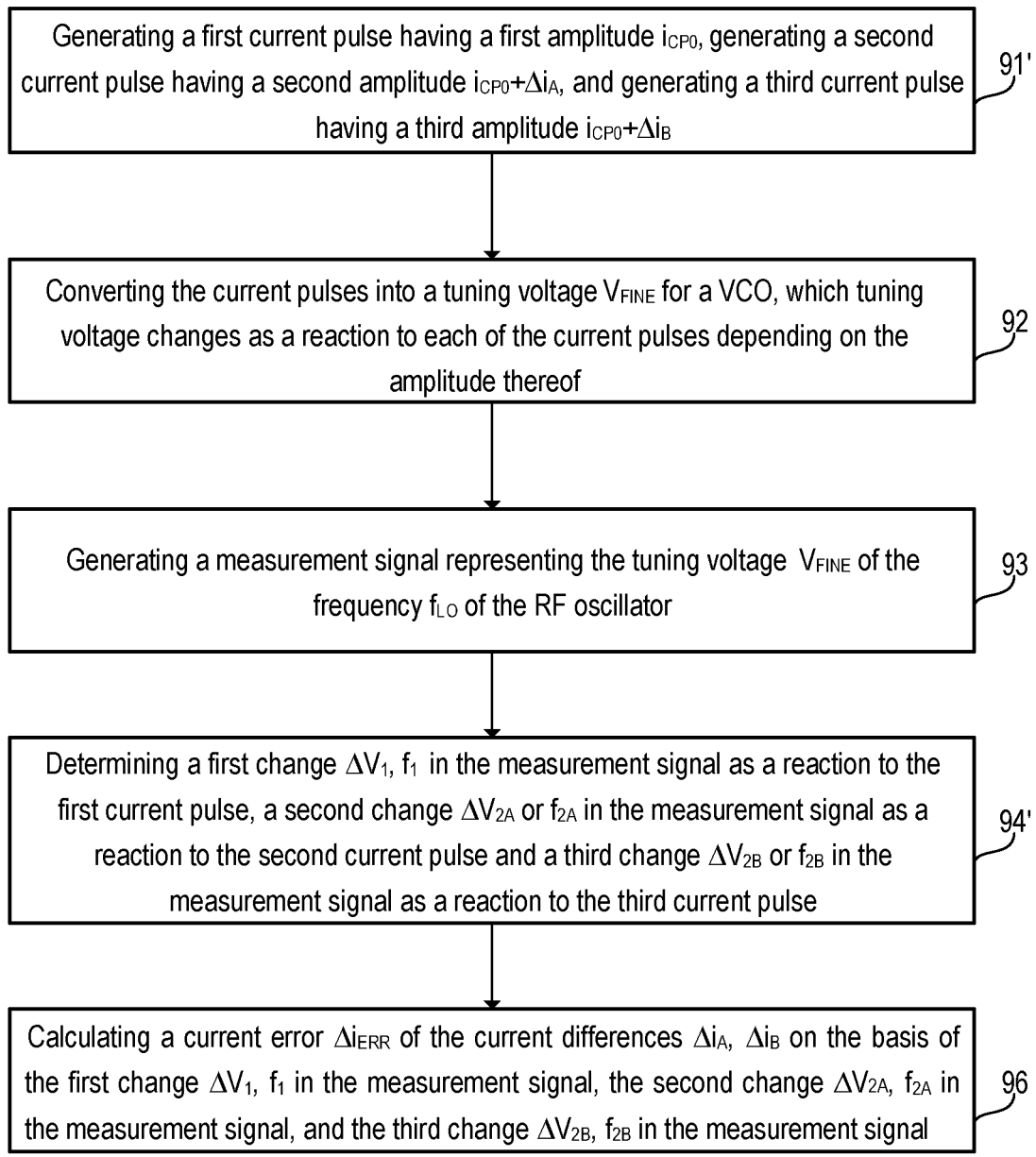
FIG. 17 is a flow diagram for illustrating a further example of the method described here.

The flow diagram in accordance with FIG. 17 shows one example of an extension of the example from FIG. 16, which, in addition to determining the first amplitude $i_{CP0}$ (or the deviation thereof from a setpoint value), also makes it possible to determine the (differential) current error $\Delta i_{ERR}$ exhibited by the amplitude differences $\Delta i$ or $\Delta i_A$, $\Delta i_B$ (see equation 17). In accordance with FIG. 17, in block 91', in addition (compared with block 91 from FIG. 16), a third current pulse having a third amplitude is generated. In block 94', in addition (compared with block 94 from FIG. 16), a third change in the measurement signal as a reaction to the third current pulse is determined. On the basis of two of the ascertained changes in the measurement signal, the first amplitude $i_{CP0}$ can be calculated (see block 95 from FIG. 16) and, on the basis of the three changes $\Delta V_1$, $\Delta V_{2A}$, $\Delta V_{2B}$ in the measurement signal, in addition the abovementioned differential error $\Delta i_{ERR}$ can also be calculated (see FIG. 17, block 96). This error can be calculated e.g. in accordance with equation 20 or with the aid of equation 22.

It should be pointed out at this juncture that the sequence in the flow diagrams from FIGS. 16 and 17 represents a logical sequence of the individual blocks, but not a mandatory temporal sequence. By way of example, the second current pulse (FIG. 17, block 91') can be generated after the first change in the measurement signal as a reaction to the first current pulse has been ascertained. Even though block 95 (see FIG. 16) is not explicitly illustrated in the example from FIG. 17, it can nevertheless be carried out (before or after block 96).

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A radio-frequency (RF) circuit comprising:
   a charge pump configured to generate current pulses having a first current amplitude and a predetermined duration;
   a capacitive element coupled to the charge pump and configured to receive the current pulses and to generate a tuning voltage based on the current pulses;
   an RF oscillator coupled to the capacitive element and configured to generate an RF signal having a frequency that is dependent on the tuning voltage;
   a measuring circuit configured to generate a measurement signal representing the tuning voltage or the frequency of the RF signal; and
   a controller circuit coupled to the charge pump and the measuring circuit and configured:

to drive the charge pump so as to change the first current amplitude of a current pulse by a current difference, to ascertain a first change in the measurement signal, wherein the first change is a reaction to a first current pulse of the current pulses having the first current amplitude, and a second change in the measurement signal, wherein the second change is a reaction to a second current pulse of the current pulses having a second current amplitude, and to calculate a measurement value for the first current amplitude based on the first change in the measurement signal, the second change in the measurement signal, and the current difference.

2. The RF circuit as claimed in claim 1,
wherein the charge pump, the capacitive element, and the RF oscillator are part of a phase-locked loop,
wherein the phase-locked loop is at least temporarily inactive, such that the charge pump is driven independently of the frequency of the RF signal.

3. The RF circuit as claimed in claim 2,
wherein an operating point of the RF oscillator is settable such that the RF oscillator generates a setpoint frequency, with the phase-locked loop being active, if the tuning voltage corresponds to a reference value.

4. The RF circuit as claimed in claim 3,
wherein the controller circuit is further configured:
to generate a further tuning voltage that determines the operating point of the RF oscillator,
before a current pulse is generated by the charge pump, with the phase-locked loop being active, to set the further tuning voltage such that the tuning voltage corresponds to a reference value.

5. The RF circuit as claimed in claim 1,
wherein the capacitive element comprises a loop filter connected downstream of the charge pump.

6. The RF circuit as claimed in claim 1, wherein the controller circuit is further configured:
to drive the charge pump such that the first current amplitude is adapted depending on the measurement value calculated for the first current amplitude.

7. The RF circuit as claimed in claim 1, wherein the controller circuit is further configured:
to calculate a component parameter of the charge pump and/or of the capacitive element based on changes in the measurement signal and the current difference.

8. The RF circuit as claimed in claim 7,
wherein the capacitive element is a loop filter and the component parameter is a total capacitance of the loop filter.

9. A method comprising:
generating current pulses having a settable current amplitude and a predetermined duration using a charge pump,
wherein generating the current pulses comprises generating a first current pulse having a first amplitude and generating a second current pulse having a second amplitude, which differs from the first amplitude by a current difference;
converting the current pulses into a tuning voltage for a radio-frequency (RF) oscillator in such a way that the tuning voltage changes as a reaction to each current pulse depending on the amplitude thereof,
wherein a frequency of the RF oscillator is dependent on the tuning voltage;
generating a measurement signal representing the tuning voltage or the frequency of the RF oscillator;

determining a first change in the measurement signal as a reaction to the first current pulse and a second change in the measurement signal as a reaction to the second current pulse; and calculating the first amplitude based on the current difference, the first change in the measurement signal, and the second change in the measurement signal.

10. The method as claimed in claim 9, further comprising:
setting an operating point of the RF oscillator, such that the RF oscillator generates a setpoint frequency if the tuning voltage corresponds to a reference value,
wherein, while setting the operating point, the charge pump and the RF oscillator are part of an active phase-locked loop.

11. The method as claimed in claim 10,
wherein the phase-locked loop is not active while generating the first current pulse and the second current pulse, such that the charge pump is driven independently of the frequency of the RF signal.

12. The method as claimed in claim 9, wherein converting the current pulses into the tuning voltage for the RF oscillator comprises:
feeding the current pulses to an input of a loop filter having a total capacitance, and
transferring charges transported by the current pulses to the total capacitance.

13. The method as claimed in claim 9,
wherein generating the current pulses additionally comprises generating a third current pulse having a third amplitude, and
wherein the method further comprises:
determining a third change in the measurement signal as a reaction to the third current pulse; and
calculating a current error of the current difference between the second amplitude and the first amplitude and/or a current difference between the third amplitude and the first amplitude based on the first change, the second change, and the third change in the measurement signal.

14. The method as claimed in claim 9, further comprising:
calculating a component parameter of the charge pump and/or of a capacitive element, which generates the tuning voltage, based on changes in the measurement signal and the current difference.

15. The method as claimed in claim 14,
wherein the capacitive element is a loop filter and the component parameter is a total capacitance of the loop filter.

16. The method as claimed in claim 15, further comprising:
adapting the total capacitance of the loop filter based on the total capacitance of the loop filter and a setpoint value for the total capacitance.

17. A radio-frequency (RF) circuit comprising:
a charge pump configured to generate current pulses,
wherein the current pulses include a first current pulse having a first amplitude and a second current pulse having a second amplitude,
wherein the second amplitude differs from the first amplitude by a current difference;
a capacitive element configured to receive the current pulses and generate a tuning voltage based on the current pulses;
an RF oscillator configured to generate an RF signal having a frequency that is dependent on the tuning voltage;

a measuring circuit configured to generate a measurement signal representing the tuning voltage or the frequency of the RF signal; and a controller circuit configured to:
- determine a first change in the measurement signal based on the first current pulse,
- determine a second change in the measurement signal based on the second current pulse, and
- calculate the first amplitude of the first current pulse based on the first change in the measurement signal, the second change in the measurement signal, and the current difference.

18. The RF circuit as claimed in claim 17,
wherein the charge pump, the capacitive element, and the RF oscillator are part of a phase-locked loop,
wherein the phase-locked loop is at least temporarily inactive, such that the charge pump is driven independently of the frequency of the RF signal.

19. The RF circuit as claimed in claim 18,
wherein an operating point of the RF oscillator is settable such that the RF oscillator generates a setpoint frequency, with the phase-locked loop being active, if the tuning voltage corresponds to a reference value.

20. The RF circuit as claimed in claim 17, wherein
the capacitive element comprises a loop filter connected downstream of the charge pump,
the RF oscillator is coupled to the capacitive element, and
the controller circuit is coupled to the charge pump and the measuring circuit.

* * * * *